(12) United States Patent
Mirabedini et al.

(10) Patent No.: US 7,138,292 B2
(45) Date of Patent: Nov. 21, 2006

(54) APPARATUS AND METHOD OF MANUFACTURE FOR INTEGRATED CIRCUIT AND CMOS DEVICE INCLUDING EPITAXIALLY GROWN DIELECTRIC ON SILICON CARBIDE

(75) Inventors: Mohammad R. Mirabedini, Redwood City, CA (US); Valeriy Sukharev, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 212 days.

(21) Appl. No.: 10/659,134

(22) Filed: Sep. 10, 2003

(65) Prior Publication Data

US 2005/0054150 A1 Mar. 10, 2005

(51) Int. Cl.
*H01L 21/00* (2006.01)
(52) U.S. Cl. .............................. 438/105; 257/E21.054
(58) Field of Classification Search ................. 438/105
See application file for complete search history.

(56) References Cited

U.S. PATENT DOCUMENTS

| | | | | |
|---|---|---|---|---|
| 5,736,753 | A * | 4/1998 | Ohno et al. ................... | 257/77 |
| 5,877,041 | A * | 3/1999 | Fuller .......................... | 438/105 |
| 6,365,919 | B1 * | 4/2002 | Tihanyi et al. ................ | 257/77 |
| 6,437,371 | B1 * | 8/2002 | Lipkin et al. ................. | 257/77 |
| 6,660,598 | B1 * | 12/2003 | Hanafi et al. ................ | 438/291 |

OTHER PUBLICATIONS

Nobuyuki Sugii, Digh Hisamoto, Katsuyoshi Washio, Natsuki Yokoyama, and Shin'ichiro Kimura, "Enhanced Performance of Strained-Si MOSFETs on CMP SiGe Virtual Substrate," IEEE, 2001, 0-7803-7052-X/01, p. 1-4.

Paul Comita, AnnaLena Thilderkvist, and Arkadii V. Samoilov, "Applied Materials FEOL Seminar 2002," Oct. 29, 2002, p. 1-37.

K. Rim, S. Koester, M. Hargrove, J. Chu, P. M. Mooney, J. Ott, T. Kanarsky, P. Ronsheim, M.Ieong, A. Grill, and H.-S. P. Wong, "Strained Si NMOSFETs for High Performance CMOS Technology," IEEE 2001 Symposium on VLSI Technology Digest of Technical Papers, 2001, p. 59 (1-2).

Yee-Chia Yeo, Qiang Lu, Chenming Hu, Tsu-Jae King, T. Kawashima, M. Oishi, S. Mashiro, and J. Sakai, "Enhanced performance in sub-100 nm CMOSFETs using strained epitaxial silicon-germanium", IEEE International Electron Device Meeting Technical Digest, pp. 753-756, San Francisco, CA, Dec. 2000, www.eecs.berkeley.edu/IPRO/Summary/01abstracts/ycyeo.1.html, p. 1-4.

R.E. Stallcup, A.F. Aviles, and J.M. Perez, "Atomic Resolution Ultrahigh Vacuum Scanning Tunneling Microscopy of Epitaxial Diamond (100) Films," Appl. Phys. Lett. 66 (18), American Institute of Physics, May 1, 1995, p. 2331-2333.

Akira Yamada, Tatsuro Watahiki, Shuhei Yagi, Katsuya Abe, and Makoto Konagai, "Epitaxial Growth of Strained $Si_{1-x}C_x$ on Si and Its Application to MOSFET," International Symposium on Quantum Effect Electronics, 2002.

* cited by examiner

*Primary Examiner*—W. David Coleman
(74) *Attorney, Agent, or Firm*—L. Jon Lindsay

(57) ABSTRACT

An integrated circuit, or portion thereof, such as a CMOS device, includes an epitaxially grown dielectric on a silicon carbide base. The epitaxially grown dielectric forms a gate dielectric and the silicon carbide base serves as a channel region for the CMOS device. In various embodiments, the epitaxially grown dielectric may be a crystalline carbon or carbon-containing film.

8 Claims, 2 Drawing Sheets

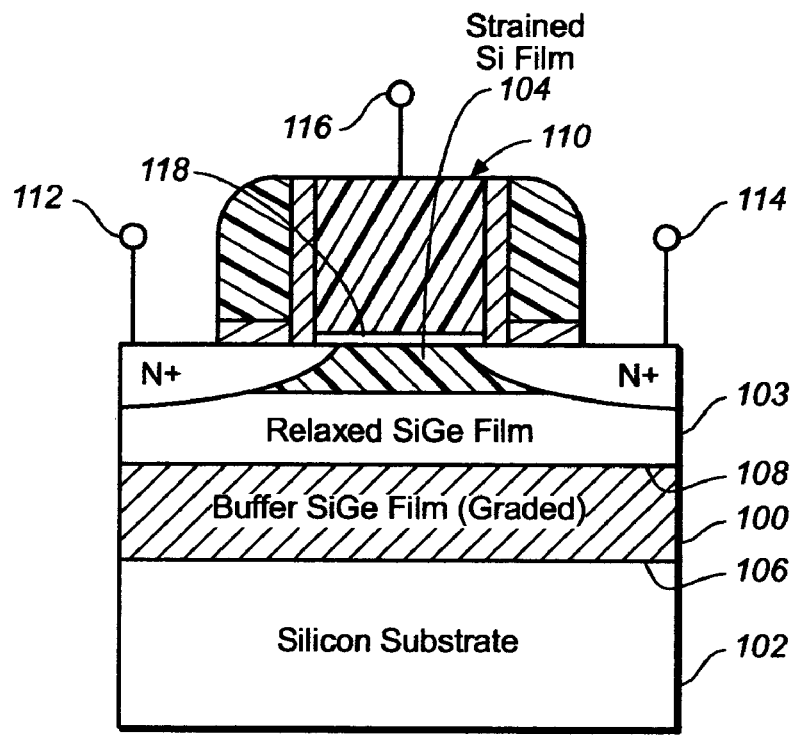
FIG._1
*(PRIOR ART)*
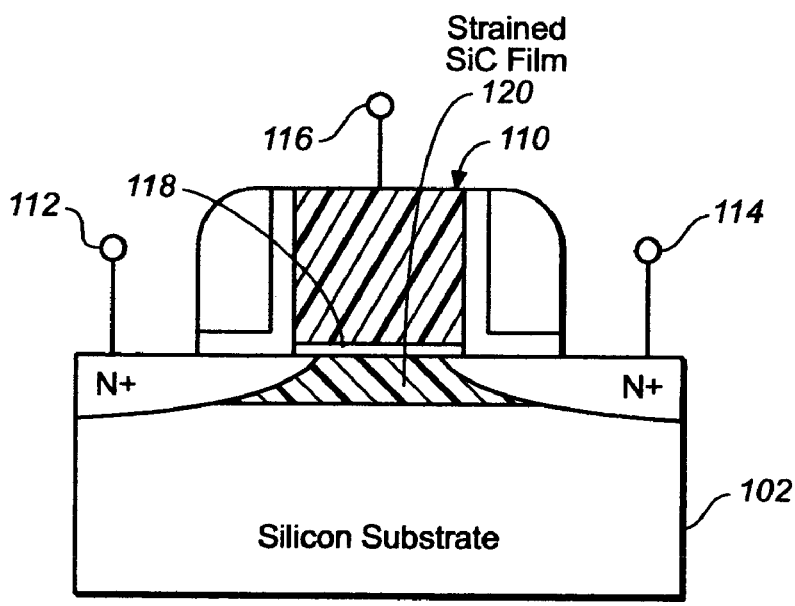
FIG._2
*(PRIOR ART)*

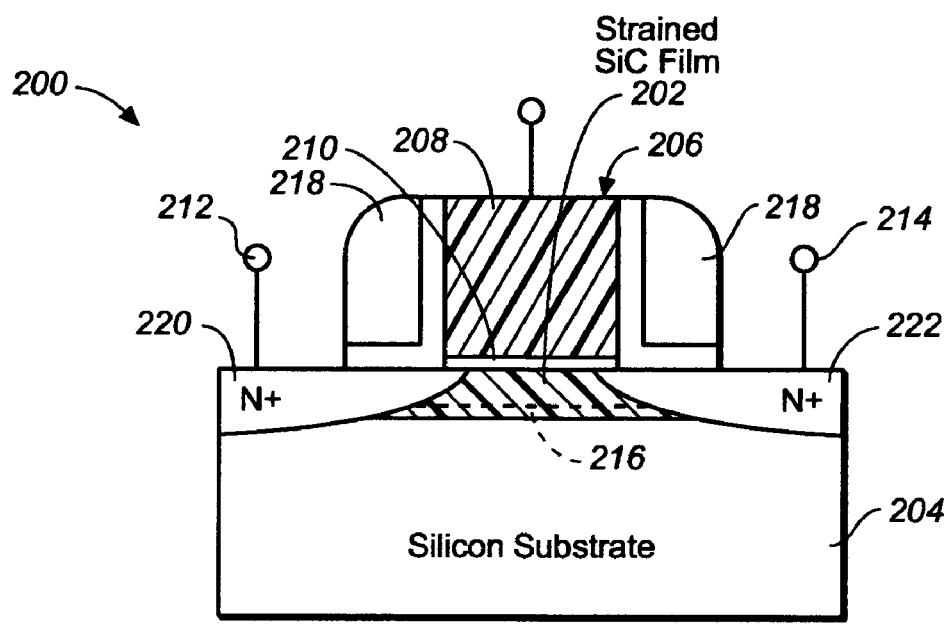
FIG._3
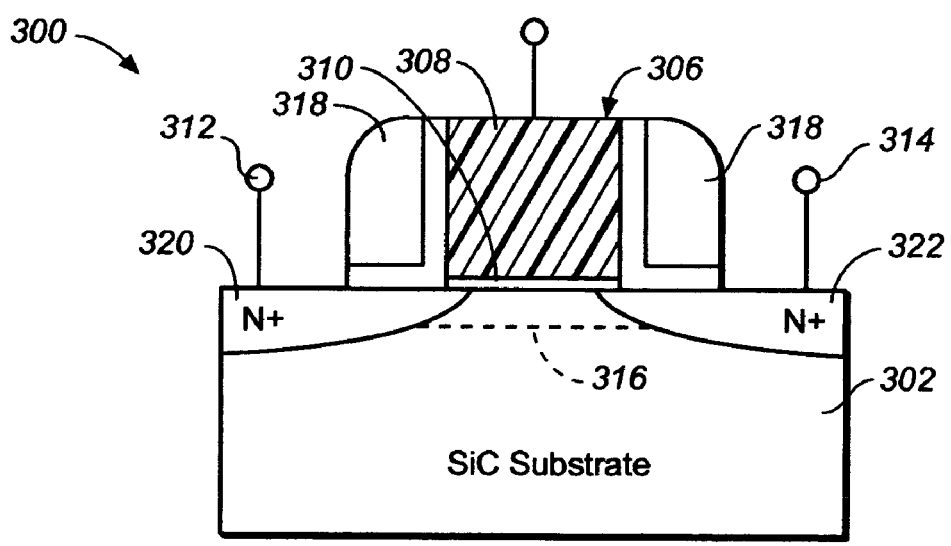
FIG._4

APPARATUS AND METHOD OF MANUFACTURE FOR INTEGRATED CIRCUIT AND CMOS DEVICE INCLUDING EPITAXIALLY GROWN DIELECTRIC ON SILICON CARBIDE

FIELD OF THE INVENTION

This invention relates to semiconductor integrated circuits (ICs). In particular, this invention relates to new and improved techniques for forming a CMOS device, such as a MOSFET, within the IC.

BACKGROUND OF THE INVENTION

A significant trend throughout IC development has been to reduce the size of the components of the IC's. As the size is reduced, the performance requirements of the materials of the components become more stringent. For CMOS devices (e.g. CMOS transistors) in particular, increased performance requirements have generally been met by aggressively scaling the thickness of the gate dielectric and the length of the channel of the transistors. As continued attempts have been made to scale down CMOS technology, however, the performance requirements for the CMOS devices have proven so stringent that scaling of either the gate dielectric and/or the channel length has become a very difficult and/or impractical solution for meeting the high performance requirements.

A gate dielectric thickness of about ten Angstroms and smaller is anticipated in next generation CMOS devices. Such thin gate dielectrics face high gate leakage current, which is detrimental to device performance and overall power consumption.

It has been suggested to use dielectric materials having a dielectric constant (K) in a range of about 7 to 30 as the gate dielectric for CMOS devices. Such a range for K is considerably larger than that for silicon dioxide (K=3.9), which is commonly used as the gate dielectric. Such higher-K dielectric materials have the potential to reduce gate leakage current and thus enable much thinner gate dielectric layers for the smaller dimensions required for new CMOS devices.

However, the higher-K dielectric materials have several limitations that have made it difficult to incorporate these materials into CMOS devices. For instance, the processes for forming the higher-K dielectric materials are generally not compatible with conventional CMOS fabrication processes. Therefore, incorporation of such materials into CMOS devices can require significant changes to the CMOS fabrication processes, which can significantly affect the cost of the resulting CMOS devices.

Additionally, the higher-K dielectric materials do not form a good interface with the silicon-based materials onto which the dielectric material must be deposited. Problems thus arise at the interface between the higher-K dielectric material and the substrate and gate electrode. For example, high interface traps may be created between the material layers (especially between the gate dielectric and the substrate). Also, channel carrier mobility may be degraded by the higher-K dielectric materials. Additionally, the higher-K dielectric materials have problems with fixed dielectric charges and thermal stability. Furthermore, the presence of the higher-K dielectric materials may limit the temperature at which further processing may be performed.

To meet the increased performance requirements of the smaller CMOS devices, it has also been suggested to increase the mobility of the carriers in the channel region. For example, strained-Silicon ("strained-Si" or "SSI") may be incorporated into the channel region, since strained-Si is known to have greater carrier mobility characteristics than does the silicon that has been more commonly used in the channel region of CMOS devices. (K Rim, S. Koester, M. Hargrove, J. Chu, P. M. Mooney, J. Ott, T. Kanarsky, P. Ronsheim, M.leong, A. Grill, and H.-S. P. Wong, "Strained-Si NMOSFETs for High Performance CMOS Technology," 2001 Symposium on VLSI Technology Digest of Technical Papers, 2001, p. 59.) Additionally, strained silicon carbide ("strained-SiC") may be incorporated into the channel region, since strained-SiC also has greater carrier mobility characteristics. (Akira Yamada, Tatsuro Watahiki, Shuhei Yagi, Katsuya Abe, and Makoto Konagai, "Epitaxial Growth of Strained Si1-xCx on Si and Its Application to MOSFET," International Symposium on Quantum Effect Electronics, 2002.)

Formation of a strained-Si layer on a semiconductor wafer has been done in a variety of ways. One technique involves complex fabrication processes, which includes multiple epitaxial growth steps. For example, a relatively thick, graded buffer silicon-germanium (SiGe) film 100 is epitaxially grown onto a silicon, or semiconductor, substrate 102, followed by epitaxial growth of a relaxed SiGe film 103 onto the buffer SiGe film 100 and epitaxial growth of a strained-Si layer 104 onto the relaxed SiGe film 103, as shown in FIG. 1. The strain in the strained-Si layer 104 is induced by the underlying SiGe films 100 and 103. The buffer SiGe film 100 is typically formed with a graded concentration of Ge in the Si, wherein the concentration of the Ge is slowly increased as the buffer SiGe film 100 is grown on the substrate 102. In order to produce high quality strained-Si it is essential to carefully control the stoichiometry of the layer during the SiGe epitaxial growth process. Thus, the introduction of the gases into the epitaxial growth reactor chamber (not shown) must be carefully varied during fabrication of the buffer SiGe film 100. In this manner, the spacing between the atoms in the crystalline structure of the buffer SiGe film 100 is slowly increased from the beginning 106 to the surface 108 of the buffer SiGe film 100. When the relaxed SiGe film 103 and the Si layer 104 are epitaxially grown on top of the buffer SiGe film 100, the increased spacing is effectively maintained between the Si atoms which leads to a straining of the Si layer 104.

A conventional CMOS device 110, having a conventional gate oxide region 118 and conventional source, drain and gate electrodes 112, 114 and 116, is then fabricated on top of the strained-Si layer 104. The increased spacing between the Si atoms in the strained-Si layer 104 enhances the mobility of the carriers in the channel region, which is formed in the strained-Si layer 104 under the gate oxide 118 and between the source and drain 112 and 114.

The presence of the strained-Si layer 104 sets limitations on the temperatures at which any subsequent processing steps may be performed, thereby limiting the flexibility with which the subsequent processing steps may be performed. Furthermore, the relatively thick SiGe film 100 acts as a thermal insulation layer, so the CMOS devices formed thereon are susceptible to self-heating during operation of the IC, thereby degrading the performance capability of the IC. Also, isolation of the CMOS device 110, typically with shallow trench isolation, must be defined in both the strained-Si layer 104 and the SiGe films 100 and 103 as well as in the silicon substrate 102, which adds to the complexity of the overall IC fabrication. Furthermore, this technique is prone to defects, which may occur in the SiGe films 100 and 103 and, thus, propagate into the strained-Si layer 104 and higher layers of materials. Such defects may involve threading dislocations in the crystalline structure of the various layers as well as "misfit" dislocations at the interface between the relaxed SiGe film 103 and the strained-Si layer 104. The dislocations, as well as precipitates nucleated at the dislocation core area, negatively impact carrier mobility, gate oxide quality and overall device performance.

The use of the strained-SiC film in the channel region of the CMOS device 110, as shown in FIG. 2, may be simpler than the strained-Si technique described above. An epitaxial growth process is performed to grow a crystalline SiC film 120 on the silicon substrate 102. Since carbon is a smaller atom than silicon, the presence of the carbon in the SiC film 120 induces a tensile strain in the crystalline lattice of the SiC film 120 due to the underlying silicon substrate 102, which enhances the mobility of the carriers therein. The CMOS transistor 110, having the source, drain and gate electrodes 112,114 and 116 and the gate oxide region 118, is then fabricated on top of the strained-SiC layer 120, with the gate oxide region 118 being deposited onto the epitaxially grown SiC film 120.

Neither of these carrier-mobility-improvement techniques compensates for the problems that arise in the use of the suggested higher-K dielectric materials for the gate oxide region 118. In particular, the inferior interface between the gate oxide region 118 and adjacent layers remains a significant issue for the CMOS processing. Special care must be taken in the formation of the gate oxide region 118 and in many subsequent processes. Additionally, the strained-Si layer 104 sets limitations on the temperatures at which any subsequent processing steps may be performed, thereby limiting the flexibility with which the subsequent processing steps may be performed. Therefore, the resulting over-all fabrication is quite complex, time-consuming and costly.

It is with respect to these and other considerations that the present invention has evolved.

SUMMARY OF THE INVENTION

The present invention evolved out of the discovery of materials that can be used in channel and gate dielectric structures of next-generation CMOS devices and that have such bonding and interface characteristics as to avoid or overcome the interface problems of the higher-K dielectric materials discussed in the background. With a SiC base, which preferably serves as a channel region of the overlying CMOS device, a compatible gate dielectric material is epitaxially grown thereon to a desired thickness depending on the EOT (equivalent oxide thickness) required for the particular application.

In various embodiments, the gate dielectric material is preferably carbon or a carbon-containing material, which has a mid-level dielectric constant (K) of about 5.7 or a range greater than about 4.5, significantly greater than the K=3.9 for conventional silicon dioxide. Additionally, the carbon and carbon-containing materials are fully compatible with the underlying SiC, so nucleation and growth of the gate dielectric material on the SiC base material is not an issue. The resulting epitaxially grown gate dielectric material has a fully crystalline structure. Thus, the interface between the gate dielectric and the underlying material is considerably better and any interface charge traps and fixed dielectric charges are considerably lower than those for the higher-K dielectric materials described in the background as suggested for use with next-generation CMOS devices.

Additionally, in a particular embodiment, the SiC base is preferably a SiC film epitaxially grown on a silicon substrate of a semiconductor wafer. In another particular embodiment, the SiC base is preferably part of a SiC substrate on which the IC fabrication is performed.

Furthermore, in another particular embodiment, a gate electrode material of SiC is preferably epitaxially grown or deposited on the carbon or carbon-containing gate dielectric material. In this manner, a good interface is also achieved between the gate electrode and the gate dielectric. Thus, the gate dielectric has a good interface on both the bottom and the top thereof.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIG. 1 is a simplified, broken, cross-sectional view of a portion of a prior art integrated circuit.

FIG. 2 is a simplified, broken, cross-sectional view of a portion of another prior art integrated circuit.

FIG. 3 is a simplified, broken, cross-sectional view of a portion of an integrated circuit in which the present invention is incorporated and which has been fabricated according to the present invention.

FIG. 4 is a simplified, broken, cross-sectional view of a portion of another integrated circuit in which an alternative embodiment of the present invention is incorporated and which has been fabricated according to the alternative embodiment of the present invention.

DETAILED DESCRIPTION

A portion of an integrated circuit (IC) 200 which incorporates a first embodiment of the present invention and which is formed by the methodology of the first embodiment of the present invention is shown in FIG. 3. The IC 200 includes a strained-SiC layer, or film, 202 (or its derivatives, such as SiGeC) formed by SiC epitaxial growth above a semiconductor layer 204, such as a silicon substrate. The strained-SiC layer 202 serves as a base for a CMOS device 206, such as an N or P MOSFET. The CMOS device 206 generally includes a gate dielectric region 210, a gate electrode region 208, source and drain regions 212 and 214, a channel region 216 and gate electrode spacers 218. The channel region 216 is within the strained-SiC layer 202 between the source and drain regions 212 and 214 under the gate dielectric region 210. The source and drain regions 212 and 214 include doped regions 220 and 222 on opposite sides of the gate electrode region 208 under the gate electrode spacers 218.

The gate dielectric region 210 is epitaxially grown on the strained-SiC layer 202, as opposed to being deposited thereon as described in the background. Thus, the gate dielectric region 210 is selected to be fully compatible with the strained-SiC layer 202 and has a fully crystalline structure. Due to the fully crystalline structure and compatibility, the gate dielectric region 210 provides an effective dielectric function with a mid-level dielectric constant K (e.g. about 5.7 or in a range greater than about 4.5) superior to the dielectric capabilities of the mid-to-high-K (e.g. K=7–30) dielectric materials described in the background. Additionally, the interface charge traps and fixed dielectric charge problems, among other issues, make the mid-to-high-K dielectric materials inferior to the epitaxially grown gate dielectric region 210, since these problems are significantly reduced under the present invention. Thus, the crystalline gate dielectric region 210, particularly in combination with the strained-SiC layer 202, enables a high-performance device primarily due to a reduced gate dielectric EOT (and an enhanced channel mobility), while avoiding other deteriorating factors attributed to devices with the higher-K dielectrics and the strained-Si channel as described in the background.

Since the gate dielectric region 210 is epitaxially grown, there is a high level of controllability over the thickness of the gate dielectric region 210. The background dielectric materials do not allow this level of controllability over thickness because these materials are deposited, rather than grown.

In various embodiments, the gate dielctric region 210 is a crystalline carbon or carbon-containing derivative (e.g. carbon derivate variations may contain silicon or fluorine). Carbon and its derivatives are compatible with SiC such that these materials can be epitaxially grown on the strained-SiC layer 202. Other materials may also be compatible with SiC and may be epitaxially grown on the strained-SiC layer 202 to form the gate dielectric region 210.

In a particular embodiment, the gate electrode region 208 is epitaxially grown on the gate dielectric region 210. In this manner, compatibility and a good interface between the gate electrode region 208 and the gate dielectric region 210 is ensured. Thus, interface problems both above and below the gate dielectric region 210 are minimized or eliminated, and performance of the CMOS device 206 is enhanced. In a preferred variation of this particular embodiment, the gate electrode region 208 is epitaxially grown SiC. Alternatively, in another embodiment, the gate electrode region 208 is a deposited SiC film. In yet another embodiment, the gate electrode region 208 is a deposited polysilicon film. Each of these embodiments, among others, enables different interface characteristics or quality. The exact material and formation technique for the gate electrode region 208 will depend on the requirements of the particular application or situation.

An advantage of the present invention is that the portion shown of the IC 200 is fully compatible with conventional CMOS processing techniques. The procedure for fabricating the portion shown of the IC 200 may be performed in a variety of ways. An exemplary fabrication procedure may include the epitaxial growth of the strained-SiC layer 202 on the semiconductor layer 204. Similarly, formation of the gate dielectric region 210 may include the epitaxial growth of a crystalline film (e.g. the crystalline carbon or carbon-containing materials) on the strained-SiC layer 202 followed by patterning and etching of the crystalline film to leave the desired gate dielectric region 210. Since the preferred gate dielectric materials (e.g. the carbon and carbon-containing materials) are fully compatible with the underlying SiC, nucleation and growth of the gate dielectric region 210 on the strained-SiC layer 204 is not an issue. The resulting epitaxially grown gate dielectric region 210 has a fully crystalline structure. Due to the compatibility of the materials and the fully crystalline structure of the gate dielectric region 210, the interface between the gate dielectric region 210 and the underlying strained-SiC layer 202 is considerably better and any interface charge traps and fixed dielectric charges are considerably lower than those for the higher-K dielectric materials described in the background as suggested for use with next-generation CMOS devices.

The doping of the doped regions 220 and 222 may be performed at an appropriate point within this procedure. Formation of the gate electrode region 208 and the gate isolation regions 218 are performed in any appropriate order, such as placement of a conductive or semiconductive film (e.g. epitaxial growth or deposition of a SiC film or deposition of a polysilicon film) for the gate electrode region 208 over the gate dielectric region 210 and the strained-SiC layer 202 followed by patterning and etching of the conductive film followed by deposition, patterning and etching of a dielectric film for the gate isolation regions 218.

A portion of an integrated circuit (IC) 300 which incorporates a second embodiment of the present invention and which is formed by the methodology of the second embodiment of the present invention is shown in FIG. 4. The IC 300 includes a SiC substrate 302, instead of a silicon substrate. The SiC substrate 302 serves as the base for a CMOS device 306, similar to the CMOS device 206 (FIG. 3). The CMOS device 306 generally includes a gate electrode region 308, a gate dielectric region 310, source and drain regions 312 and 314, a channel region 316 and gate isolation regions 318. The channel region 316 is within the SiC substrate 302 between the source and drain regions 312 and 314 under the gate dielectric region 310. The source and drain regions 312 and 314 include doped regions 320 and 322 on opposite sides of the gate dielectric region 310 under the gate isolation regions 318 within the SiC substrate 302.

The use of the SiC substrate 302 eliminates the need to epitaxially grow the strained-SiC layer 202 (FIG. 3) on the semiconductor layer 204 (FIG. 3). Therefore, fabrication of the IC 300, at least of the portion shown in FIG. 4, is simplified over the embodiment shown in FIG. 3. Wafers of the SiC substrate 302, however, may be more expensive than wafers of a Si substrate (e.g. semiconductor layer 204, FIG. 3). Selection between the SiC and Si wafers may depend on the availability of the SiC wafers and the requirements of the particular application.

The gate dielectric region 310 may be formed similar to the gate dielectric region 210 (FIG. 3). Thus, the gate dielectric region 310 is preferably an epitaxially grown crystalline dielectric material, such as carbon or carbon-containing materials. Likewise, with slight variations, the remaining parts of the CMOS device 306 may be formed similar to corresponding parts of the CMOS device 206 (FIG. 3). The doping of the doped regions 320 and 322 may be somewhat different from the doping of the doped regions 220 and 222 (FIG. 3) since the materials into which the dopants (not shown) are placed are slightly different in each case (e.g. the strained-SiC layer 202 and the semiconductor layer 204 for the doped regions 220 and 222, and the SiC substrate 302 for the doped regions 320 and 322).

Presently preferred embodiments of the present invention and many of its improvements have been described with a degree of particularity. This description is of preferred examples of implementing the invention, and is not necessarily intended to limit the scope of the invention. The scope of the invention is defined by the following claims.

The invention claimed is:

1. A method of forming a portion of an integrated circuit comprising:
   providing a silicon carbide base;
   epitaxially growing a dielectric film on the silicon carbide base by forming a crystalline carbon-containing film on the silicon carbide base; and
   forming a CMOS device on the silicon carbide base and epitaxially grown dielectric film, wherein the CMOS device includes a channel region and a gate dielectric, the channel region is formed in the silicon carbide base and the gate dielectric is formed by the epitaxially grown dielectric film.

2. A method of forming a portion of an integrated circuit comprising:
providing a silicon carbide base;
epitaxially growing a dielectric film on the silicon carbide base by forming a crystalline carbon film on the silicon carbide base; and
forming a CMOS device on the silicon carbide base and epitaxially grown dielectric film, wherein the CMOS device includes a channel region and a gate dielectric, the channel region is formed in the silicon carbide base and the gate dielectric is formed by the epitaxially grown dielectric film.

3. A method of forming a portion of an integrated circuit comprising:
providing a silicon substrate;
epitaxially growing a silicon carbide base on the silicon substrate;
epitaxially growing a dielectric film on the silicon carbide base; and
forming a CMOS device on the silicon carbide base and epitaxially grown dielectric film, wherein the CMOS device includes a channel region and a gate dielectric, the channel region is formed in the silicon carbide base and the gate dielectric is formed by the epitaxially grown dielectric film.

4. A method of forming a portion of an integrated circuit comprising:
providing a silicon carbide base;
epitaxially growing a dielectric film on the silicon carbide base; and
forming a CMOS device on the silicon carbide base and epitaxially grown dielectric film including forming a silicon carbide region on the epitaxially grown dielectric film, wherein the CMOS device includes a channel region, a gate dielectric and a gate electrode, the channel region is formed in the silicon carbide base, the gate dielectric is formed by the epitaxially grown dielectric film and the gate electrode is formed by the silicon carbide region.

5. A method as defined in claim 4 wherein:
the step of forming the silicon carbide region on the epitaxially grown dielectric film further comprises epitaxially growing a silicon carbide layer on the epitaxially grown dielectric film.

6. A method as defined in claim 4 wherein:
the step of forming the silicon carbide region on the epitaxially grown dielectric film further comprises depositing a silicon carbide layer on the epitaxially grown dielectric film.

7. A method of forming a CMOS device having a channel region and a gate dielectric region in an integrated circuit comprising:
providing a semiconductor substrate;
epitaxially growing a strained silicon carbide film on the semiconductor substrate;
epitaxially growing a crystalline carbon-containing film on the silicon carbide film;
forming the gate dielectric region of the CMOS device in the epitaxially grown crystalline carbon-containing film; and
forming the channel region of the CMOS device in the epitaxially grown strained silicon carbide film.

8. A method as defined in claim 7 wherein the CMOS device further has a gate electrode region, further comprising:
epitaxially growing a silicon carbide film on the crystalline carbon-containing film of the gate dielectric region; and
forming the gate electrode region of the CMOS device in the silicon carbide film epitaxially grown on the crystalline carbon-containing film of the gate dielectric region.

* * * * *